(12) United States Patent
Meyer (10) Patent No.: US 9,446,678 B2
(45) Date of Patent: Sep. 20, 2016

(54) BATTERY MODEL WITH ROBUSTNESS TO CLOUD-SPECIFIC COMMUNICATION ISSUES

(71) Applicant: Ford Global Technologies, LLC, Dearborn, MI (US)

(72) Inventor: Jason Meyer, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 230 days.

(21) Appl. No.: 14/197,725

(22) Filed: Mar. 5, 2014

(65) Prior Publication Data
US 2015/0251556 A1 Sep. 10, 2015

(51) Int. Cl.
*B60L 11/18* (2006.01)
*B60W 10/26* (2006.01)
*G01R 31/36* (2006.01)
(Continued)

(52) U.S. Cl.
CPC ............ *B60L 11/1861* (2013.01); *B60K 6/442* (2013.01); *B60L 3/0046* (2013.01); *B60L 3/12* (2013.01); *B60L 7/14* (2013.01); *B60L 11/123* (2013.01); *B60L 11/14* (2013.01); *B60L 11/1857* (2013.01); *B60L 11/1864* (2013.01); *B60L 11/1877* (2013.01); *B60L 15/2009* (2013.01); *B60W 10/26* (2013.01); *G01R 31/3606* (2013.01); *G01R 31/3648* (2013.01); *B60L 2210/10* (2013.01); *B60L 2210/40* (2013.01); *B60L 2240/545* (2013.01); *B60L 2240/547* (2013.01); *B60L 2240/549* (2013.01); *B60L 2240/70* (2013.01); *B60L 2240/80* (2013.01); *B60L 2260/44* (2013.01); *B60W 2510/244* (2013.01); *G01R 31/3651* (2013.01); *Y02T 10/6217* (2013.01); *Y02T 10/6234* (2013.01); *Y02T 10/645* (2013.01); *Y02T 10/7005* (2013.01); *Y02T 10/7044* (2013.01); *Y02T 10/7061* (2013.01); *Y02T 10/7077* (2013.01); *Y02T 10/7216* (2013.01); *Y02T 10/7241* (2013.01);
(Continued)

(58) Field of Classification Search
CPC .............. B60L 11/1861; B60W 10/26; G01R 31/3648; G01R 31/3606
USPC ...................... 324/427; 320/132, 149; 702/63
See application file for complete search history.

(56) References Cited

U.S. PATENT DOCUMENTS 8,950,009 B2 * 2/2015 Vijayan ................... G06F 21/60
726/31
8,989,954 B1 3/2015 Addepalli et al.
(Continued)

OTHER PUBLICATIONS

Non-Final Rejection of Aug. 17, 2015 in U.S. Appl. No. 14/197,696.
(Continued)

*Primary Examiner* — Edward Tso
*Assistant Examiner* — Dung V Bui
(74) *Attorney, Agent, or Firm* — David B. Kelley; Brooks Kushman P.C.

(57) ABSTRACT

A vehicle may include battery cells and a controller configured to control the vehicle, based on a state observation of the battery cells, using model parameters computed according to controller-determined cell nominal parameters adjusted by remotely-determined cell delta parameters, the delta parameters received from an external computing device responsive to cell measurements relating to a cell battery model sent to the external computing device, the delta parameters indicating adjustments that improve accuracy of the nominal parameters.

18 Claims, 6 Drawing Sheets

(51) Int. Cl.
*B60K 6/442* (2007.10)
*B60L 3/00* (2006.01)
*B60L 3/12* (2006.01)
*B60L 7/14* (2006.01)
*B60L 11/12* (2006.01)
*B60L 11/14* (2006.01)
*B60L 15/20* (2006.01)

(52) U.S. Cl.
CPC ......... *Y02T 10/7275* (2013.01); *Y02T 10/7291* (2013.01); *Y02T 90/16* (2013.01)

(56) References Cited

U.S. PATENT DOCUMENTS

| | | | |
|---|---|---|---|
| 9,098,876 B2 * | 8/2015 | Steven | G06Q 30/0283 |
| 9,171,276 B2 * | 10/2015 | Steven | G06Q 10/06314 |
| 2010/0121588 A1 | 5/2010 | Elder et al. | |
| 2010/0185357 A1 | 7/2010 | Mizumachi | |
| 2010/0196748 A1 | 8/2010 | Ellwanger | |
| 2010/0317420 A1 * | 12/2010 | Hoffberg | G06Q 30/0207 463/1 |
| 2011/0029157 A1 | 2/2011 | Muzaffer | |
| 2011/0202221 A1 | 8/2011 | Sobue et al. | |
| 2012/0258777 A1 | 10/2012 | Huang | |
| 2012/0290234 A1 | 11/2012 | Schaefer | |
| 2012/0296482 A1 * | 11/2012 | Steven | G06Q 50/06 700/291 |
| 2012/0317432 A1 | 12/2012 | Assad et al. | |
| 2012/0330475 A1 | 12/2012 | Chen | |
| 2013/0079964 A1 | 3/2013 | Sukkari et al. | |
| 2013/0097276 A1 | 4/2013 | Sridhar | |
| 2013/0179007 A1 | 7/2013 | Dalum | |
| 2013/0179061 A1 * | 7/2013 | Gadh | B60L 11/1842 701/123 |
| 2013/0201316 A1 * | 8/2013 | Binder | H04L 67/12 348/77 |
| 2014/0018985 A1 | 1/2014 | Gupta et al. | |
| 2014/0210638 A1 | 7/2014 | Gussen et al. | |
| 2014/0278167 A1 * | 9/2014 | Frost | G01R 31/3624 702/63 |
| 2014/0316728 A1 * | 10/2014 | Zhong | G01R 31/3651 702/63 |
| 2014/0371962 A1 | 12/2014 | Smith | |
| 2014/0379183 A1 | 12/2014 | Long | |
| 2014/0379284 A1 | 12/2014 | Heo et al. | |
| 2015/0066224 A1 | 3/2015 | Uyeki | |
| 2015/0158397 A1 | 6/2015 | Soto et al. | |
| 2015/0251556 A1 * | 9/2015 | Meyer | B60L 11/1861 701/22 |

OTHER PUBLICATIONS

Website http://www.wired.com/autopia/2011/04/toyota-microsoft-to-bring-the-cloud-to-cars/SQUATRIGLIA. Apr. 6, 2011, 12 pages, "Toyota, Microsoft to Bring the Cloud to Cars."

Abstract for Wu et al. Oct. 15-17, 2011, 1 Page, 2011 4th International Congress on Image and Signal Processing, "A Batter Management Sytem for Electric Vehicle Based on Zigbee and Can."

Final Rejection of Dec. 23, 2015 in U.S. Appl. No. 14/197,696.

* cited by examiner

BATTERY MODEL WITH ROBUSTNESS TO CLOUD-SPECIFIC COMMUNICATION ISSUES

TECHNICAL FIELD

The disclosure relates to improving battery state of charge estimation by using cloud computing resources.

BACKGROUND

Modern hybrid and electric vehicles utilize battery packs to provide energy for propulsion and for storing regenerated energy. Battery packs are typically composed of multiple individual battery cells that may be connected in parallel, series or some combination thereof. A characteristic of the battery pack is state of charge (SOC). The battery pack SOC is a measure of the fraction of the total charge that remains in the battery pack and may be considered analogous to a fuel gauge. SOC may be important for determining when and how to charge or discharge the battery pack. SOC may also be important for providing information to the driver, such as vehicle drive range, and for operating the vehicle. Other characteristics of the battery pack include battery power limits that define the maximum rates at which the battery can safely discharge stored energy (i.e., discharge power limits) and safely store additional energy (i.e., charge power limits) without damaging the battery or any other connected system.

SUMMARY

In a first illustrative embodiment, a vehicle includes battery cells; and a controller configured to control the vehicle, based on a state observation of the battery cells, using model parameters computed according to controller-determined cell nominal parameters adjusted by remotely-determined cell delta parameters, the delta parameters received from an external computing device responsive to cell measurements relating to a cell battery model sent to the external computing device, the delta parameters indicating adjustments that improve accuracy of the nominal parameters.

In a second illustrative embodiment, a computing device is configured to receive, from a vehicle via a communication network, battery cell measurements corresponding to a battery model of battery cells of the vehicle; and send, to the vehicle via the communication network responsive to the measurements, cell delta parameters indicating adjustments to cell nominal parameters determined by the vehicle for the cells, the delta parameters indicating adjustments that improve accuracy of the nominal parameters In a third illustrative embodiment, a method includes controlling a vehicle by a controller, based on a state observation of battery cells, using model parameters computed according to controller-determined cell nominal parameters adjusted by remotely-determined cell delta parameters, the delta parameters received by the controller from an external computing device responsive to cell measurements relating to a battery model sent to the computing device, the delta parameters indicating adjustments that improve accuracy of the nominal parameters.

DETAILED DESCRIPTION

As required, detailed embodiments of the present invention are disclosed herein; however, it is to be understood that the disclosed embodiments are merely exemplary of the invention that may be embodied in various and alternative forms. The figures are not necessarily to scale; some features may be exaggerated or minimized to show details of particular components. Therefore, specific structural and functional details disclosed herein are not to be interpreted as limiting, but merely as a representative basis for teaching one skilled in the art to variously employ the present invention.

SOC estimation may utilize a model-based method, such as Kalman filtering, to determine SOC. A model-based method works by defining a model of a battery cell and then predicting the internal states of the battery cell based on some actual measured values. Estimated internal states may include, but are not limited to, battery internal resistance or SOC. A typical approach is to apply a Kalman filter to each cell of the battery pack, and then use these cell values for calculating the overall pack characteristics. This may requires a battery control module capable of executing a number of Kalman filters that is equal to the number of cells present in the battery pack, as well as a memory capable of storing state information for each of the modeled cells. The number of cells in a battery pack varies, but a modern vehicle battery pack may consist of 62 to 100 or more cells.

Rather than performing SOC estimation solely by the vehicle, aspects of the SOC computation may be offloaded to a computing service external to the vehicle. One such external computing service may include a cloud-based computing server accessible via a network connection from the vehicle to the Internet. For example, using a model-based approach to SOC estimation including separation of parameter identification and state observation, the parameter identification task may be offloaded to the external service, reducing the amount of computation and state required to be maintained by the vehicle. In such an approach, the vehicle may collect input information regarding a vehicle battery (e.g., voltage, current, temperature, SOC, etc.), forward the information to the external service, and receive model parameters from the service (e.g., battery equivalent circuit model parameters) to be used in vehicle SOC estimation.

By incorporating the computational power of the external computing service, a vehicle may be able to take advantage of more sophisticated and accurate battery models than may be calculated using the computing resources of the vehicle. However, the rate at which the externally-identified battery parameters are received by the vehicle may be much slower than the calculation rate utilized within the battery control module. Thus, as the actual battery state changes continuously, parameter errors may grow in the time periods between updates, reducing the accuracy of computed values that rely on the externally-computed parameters (e.g. battery power limits, SoC estimates, etc.). By partitioning the determination of battery parameters into a known nominal feed-forward portion computed by a function, and an unknown dynamically-identified portion computed as a delta to the function, the vehicle may be configured to improve the robustness of offloaded parameter estimation, allowing for slower cloud update rates and better vehicle recovery from intermittent data loss.

While the disclosed approach is discussed with respect to SOC computation for a vehicle, it should be noted that the approach may be applied to other types of model identification or model-based control or estimation applications, in which a model identification algorithm may be updated at a slower rate than the controller or estimator determine system values.

Figure 1:
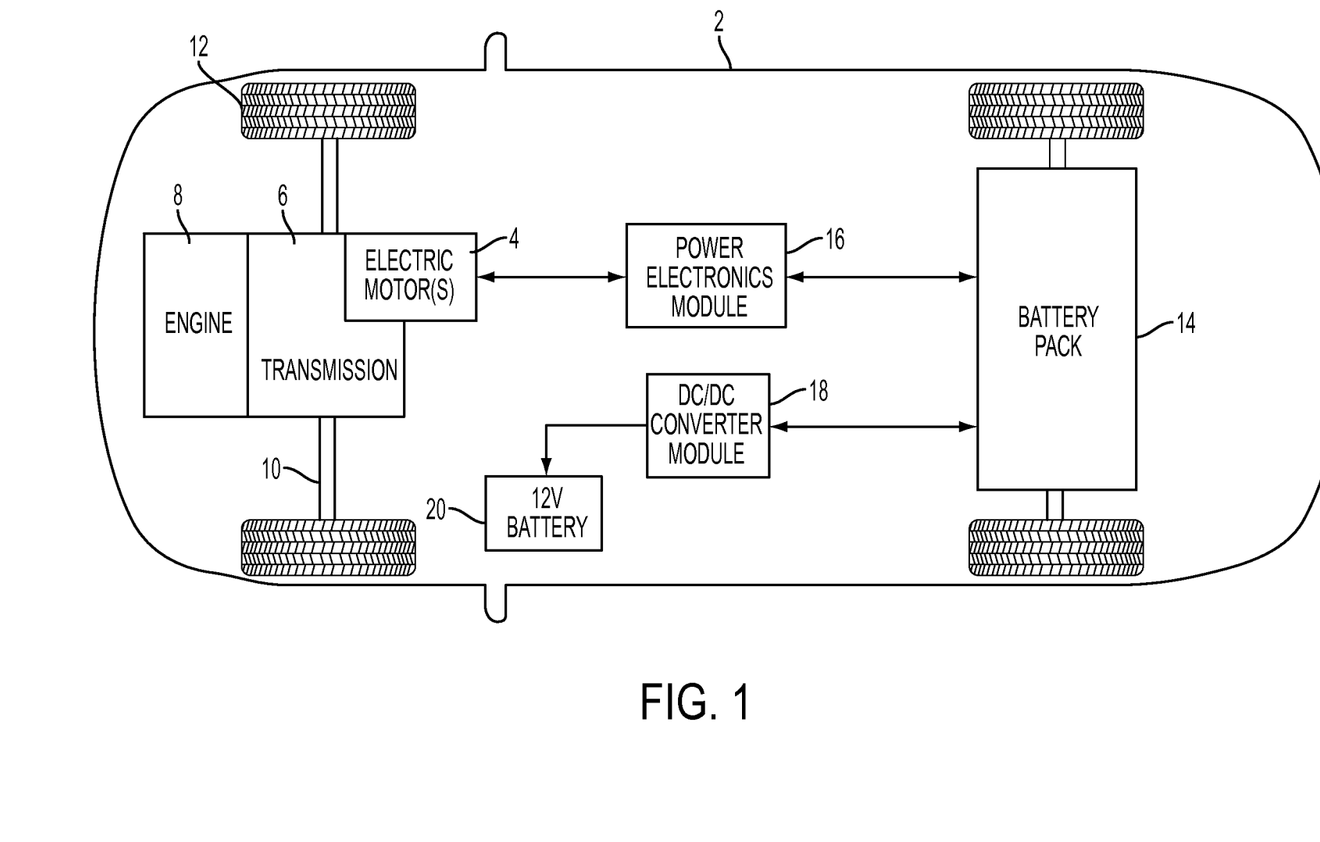
FIG. 1 is a diagram of a hybrid-electric vehicle illustrating drivetrain and energy storage components.

FIG. 1 depicts a hybrid-electric vehicle 2. The typical hybrid-electric vehicle 2 may include one or more electric motors 4 mechanically connected to a hybrid transmission 3. In addition, the hybrid transmission 6 is mechanically connected to an engine 8. The hybrid transmission 6 is also mechanically connected to a drive shaft 10 that is mechanically connected to the wheels 12. The electric motors 4 can provide propulsion and deceleration capability when the engine 8 is turned on or off. The electric motors 4 also act as generators and can provide fuel economy benefits by recovering energy that would normally be lost as heat in the friction braking system. The electric motors 4 may also provide reduced pollutant emissions since the hybrid electric vehicle 2 may be operated in electric mode under certain conditions.

The battery pack 14 stores energy that can be used by the electric motors 4. A vehicle battery pack 14 typically provides a high voltage DC output. The battery pack 14 is electrically connected to the power electronics module 16. The power electronics module 16 is also electrically connected to the electric motors 4 and provides the ability to bi-directionally transfer energy between the battery pack 14 and the electric motors 4. For example, a typical battery pack 14 may provide a DC voltage while the electric motors 4 may require a three-phase AC current to function. The power electronics module 16 may convert the DC voltage to a three-phase AC current as required by the electric motors 4. In a regenerative mode, the power electronics module 16 will convert the three-phase AC current from the electric motors 4 acting as generators to the DC voltage required by the battery pack 14. The method described herein is equally applicable to a pure electric vehicle or any other device using a battery pack.

In addition to providing energy for propulsion, the battery pack 14 may provide energy for other vehicle electrical systems. A typical system may include a DC/DC converter module 18 that converts the high voltage DC output of the battery pack 14 to a low voltage DC supply that is compatible with other vehicle loads. Other high voltage loads may be connected directly without the use of a DC/DC converter module 18. In a typical vehicle, the low voltage systems are electrically connected to a 12V battery 20.

Figure 2:
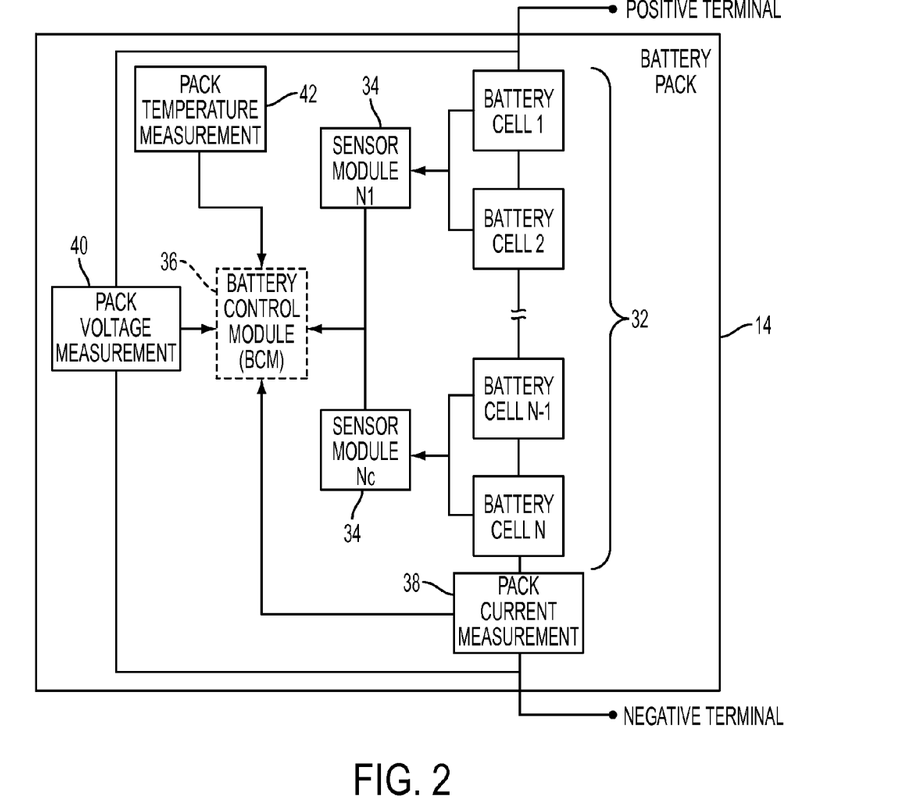
FIG. 2 is a diagram of a possible battery pack arrangement comprised of multiple cells, and monitored and controlled by a battery control module.

Battery packs 14 may be constructed from a variety of chemical formulations. Typical battery pack 14 chemistries are lead acid, nickel-metal hydride (NIMH) or Lithium-Ion. FIG. 2 shows a typical battery pack 14 in a simple series configuration of N battery cells 32. Other battery packs 14, however, may be composed of any number of individual battery cells connected in series or parallel or some combination thereof. A typical system may have a one or more controllers, such as a battery control module (BCM) 36 that monitors and controls the performance of the battery pack 14. The BCM 36 may monitor several battery pack 14 level characteristics such as pack current 38, pack voltage 40 and pack temperature 42.

In addition to the pack level characteristics, there may be battery cell level characteristics that need to be measured and monitored. For example, the terminal voltage, current, and temperature of each cell may be measured. A system may use a sensor module 34 to measure the battery cell characteristics. Depending on the capabilities, the sensor module 34 may measure the characteristics of one or multiple of the battery cells 32. The battery pack 14 may utilize up to N, sensor modules 34 to measure the characteristics of all the battery cells 32. Each sensor module 34 may transfer the measurements to the BCM 36 for further processing and coordination. The sensor module 34 may transfer signals in analog or digital form to the BCM 36.

Figure 3:
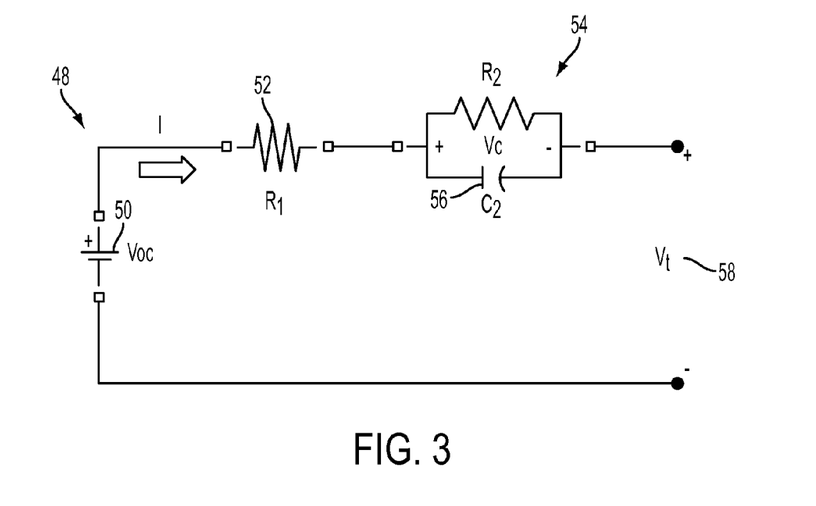
FIG. 3 is a diagram of an example battery cell equivalent circuit.

FIG. 3 is a diagram of an example battery cell equivalent circuit model 48. A battery cell can be modeled as a voltage source ($V_{oc}$) 50 having resistances (52 and 54) and capacitance 56 associated with it. More specifically, the battery cell equivalent circuit model 48 may be a Randles circuit having an active electrolyte resistance $R_1$ 52, in series with the parallel capacitance $C_2$ 54 and an active charge transfer resistance $R_2$ 56. Because of the battery cell impedance, the terminal voltage, V 58, is typically not the same as the open-circuit voltage, $V_{oc}$ 50. The open-circuit voltage, $V_{oc}$ 50, is not readily measurable as only the terminal voltage 58 of the battery cell is accessible for measurement. Because the $V_{oc}$ 50 is not readily measurable, a model-based method such as the Randles model may be used to estimate its value. While the Randles circuit model is utilized herein as an example, other battery models may be utilized as well. For example, the model 48 may include a higher-order Randle circuit model, another type of battery equivalent circuit model, a battery electro-chemical model, or some other model of the battery cell or components of the cell.

The Randles equivalent circuit model of FIG. 3 may allow the calculation of predictive battery system parameters. The Randles circuit model may be represented by the following equation:

$$\frac{dV_2(t)}{dt} = \frac{1}{C_2}I(t) - \frac{1}{R_2 C_2}V_2(t) \qquad (1)$$

where $V_2$ is the voltage of the R-C circuit, I is the current exciting the circuit, t is time, and $R_2$ (i.e., resistance 54) and $C_2$ (i.e., capacitance 56) represent battery dynamics changing during vehicle operation. For a battery with capacity Q, SOC may be defined as a percentage of available charge as compared with maximum charge capacity Q as follows:

$$SoC(t) = \frac{1}{Q}\int I(t)dt \qquad (2)$$

Moreover, the terminal voltage V 58 may be modeled as follows:

$$V_t(t) = I(t)R_1 + V_2(t) + f_{oc}(SoC(t)) \qquad (3)$$

Figure 4:
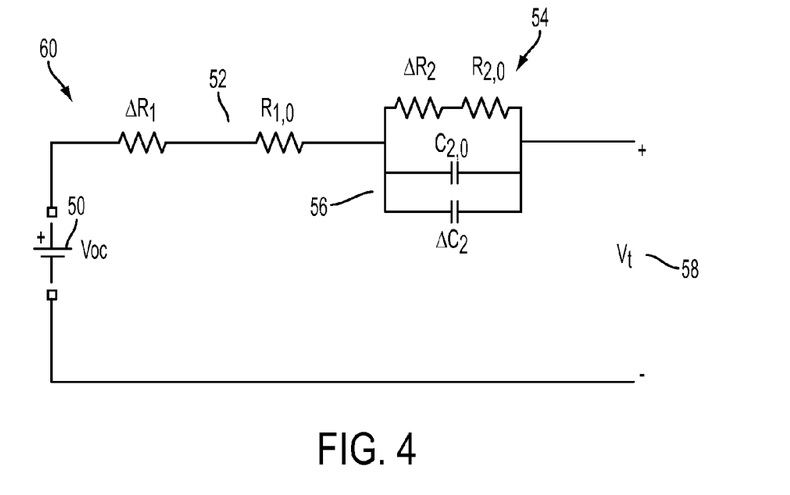
FIG. 4 is a diagram of a modified battery cell equivalent model partitioning battery parameters into nominal values and delta values.

FIG. 4 is a diagram of a modified battery cell equivalent model 60 partitioning the battery parameters into nominal parameter value 62 and delta parameter value 64 portions. In the modified model 60, the battery system may still be modeled as a Randles circuit model (e.g., of any order desired). However, each circuit element (e.g., resistance 52, resistance 54, capacitance 56, etc.) may be represented by a set of multiple circuit elements equivalent to the overall circuit element. For example, each resistance may be modeled as a pair of resistances connected in series, and each capacitance may be modeled as a pair of capacitances connected in parallel. Each pair may include an ideal element which varies according to a smooth function of the operating conditions (e.g., temperature, SOC, state of health, etc.), and a blackbox, delta or unknown element which represents all of the factors not otherwise captured by the ideal element.

Using the modified battery cell equivalent model 60 structure, the nominal or ideal value of each battery parameter may be predicted in a feed-forward manner according to the smooth function. As a result, the battery parameter estimation system needs only to estimate the values of the blackbox elements. These blackbox elements may be modeled as delta perturbations around the ideal values. For example, resistance 52 may be modeled as a nominal parameter value 62 $R_{1,0}$ and a delta value parameter value 64 $\Delta R_1$, such that the total value of resistance 52 equals the sum of the partitioned values $R_1 = R_{1,0} + \Delta R_1$. Similarly, the resistance 54 may be modeled as a nominal parameter value 62 $R_{2,0}$ and a delta parameter value 64 $\Delta R_2$, such that the total value of resistance 54 equals the sum of the partitioned values $R_2 = R_{2,0} + \Delta R_2$. Additionally, the capacitance 56 may be modeled as a nominal parameter value 62 $C_{2,0}$ and a delta parameter value 64 $\Delta C_2$, such that the total value of capacitance 56 equals the sum of the partitioned values $C_2 = C_{2,0} + \Delta C_2$.

Accounting for these summed portions, the modified first order Randles circuit model 60 may accordingly be represented by the following equation:

$$\frac{dV_2(t)}{dt} = \frac{1}{C_{2,0} + \Delta C_2} I(t) - \frac{1}{(R_{2,0} + \Delta R_2)(C_{2,0} + \Delta C_2)} V_2(t) \quad (4)$$

Moreover, the terminal voltage V 58 may be represented as follows:

$$V_t(t) = I(t)(R_{1,0} + \Delta R_1) + V_2(t) + f_{oc}(SoC(t)) \quad (5)$$

Despite these differences in the modified model, SOC may continue to be modeled as specified in equation 2.

As an alternative, as opposed to the model 60 in which the delta parameter values 64 are given an additive effect, a modified battery cell equivalent model 60 may be utilized in which the delta parameter values 64 are given a multiplicative effect. For example, resistance 52 may be modeled a nominal parameter value 62 $R_{1,0}$ and a delta parameter value 64 $\Delta R_1$, such that the total value of resistance 52 equals the product of the partitioned values $R_1 = R_{1,0}(1 + \Delta R_1)$. Similarly, the resistance 54 may be modeled as a nominal parameter value 62 $R_{2,0}$ and a delta parameter value 64 $\Delta R_2$, such that the total value of resistance 54 equals the product of the partitioned values $R_2 = R_{2,0}(1 + \Delta R_2)$. Additionally, the capacitance 56 may be modeled as a nominal parameter value 62 $C_{2,0}$ and a delta parameter value 64 $\Delta C_2$, such that the total value of capacitance 56 equals the product of the partitioned values $C_2 = C_{2,0}(1 + \Delta C_2)$.

Thus, the alternate modified first order Randles circuit model 60 may be represented by the following equation:

$$\frac{dV_2(t)}{dt} = \frac{1}{C_{2,0}(1 + \Delta C_2)} I(t) - \frac{1}{R_{2,0}(1 + \Delta R_2)C_{2,0}(1 + \Delta C_2)} V_2(t) \quad (6)$$

Moreover, the terminal voltage V 58 may be represented as follows:

$$V_t(t) = I(t)R_{1,0}(1 + \Delta R_1) + V_2(t) + f_{oc}(SoC(t)) \quad (7)$$

In either model 60, the nominal values 62 may be predicted as a function of battery temperature and possibly other variables, such as cumulative Ampere-hour throughput or SOC. In some cases, the feed-forward parameter estimates may be slowly adapted over the life of the battery, e.g., to account for capacity Q differences in the behavior of the battery as it ages. The delta parameter values 64 may be identified using an extended Kalman filter utilizing the circuit model 60. For instance, the delta parameter values 64 may be determined as a difference between the nominal parameter values 62 and the model parameters determined by the filter. The delta parameters can alternatively be directly identified by a Kalman filter. Notably, the nominal parameter value 62 feed-forward determination may be significantly less computation and storage-intensive than the determination of the delta parameter values.

Figure 5:
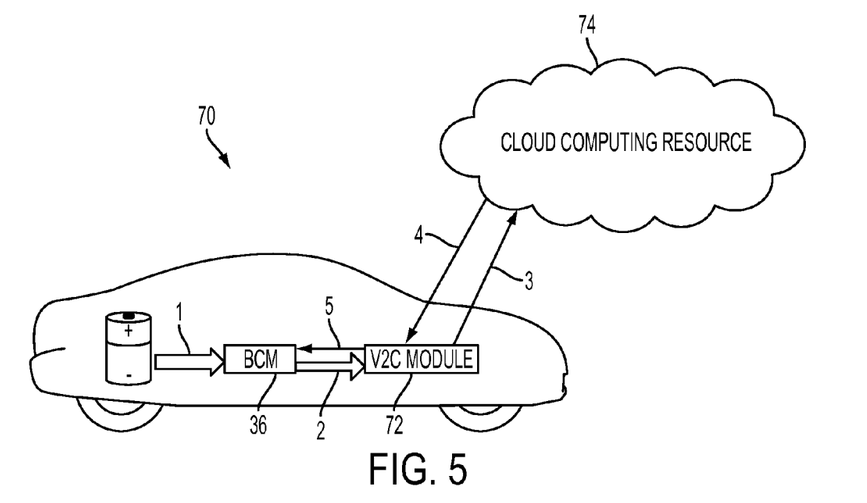
FIG. 5 is a diagram of a cloud-based architecture for offloading parameter identification tasks from a vehicle.

FIG. 5 is a diagram of a cloud-based architecture 70 for offloading computing tasks from a vehicle. The architecture 70 includes a BCM 36 in communication with a vehicle to cloud module 72, wherein the cloud module 72 is configured to facilitate vehicle communications with cloud computing resources 74.

As indicated in the architecture 70 as flow (1), the BCM 36 may be configured to manage the battery and perform battery cell measurements of various battery variables. Moreover, as indicated by flow (2), BCM 36 may be further configured to forward inputs to the cloud module 72. The cloud module 72 may be configured to receive the inputs, and, as indicated by flow (3), forward the inputs over a mobile link to the cloud computing resource 74 (e.g., via a vehicle telematics controller). The cloud computing resource 74 may be configured to perform calculations based on the received inputs. As indicated by flow (4), the cloud computing resource 74 may be further configured to return a response over the mobile link to the cloud module 72 including the results of the calculations. The cloud module 72 may receive the response, and, as indicated by flow (5), forward the results of the calculations back to the BCM 36. The BCM 36 may accordingly use the results of the calculations computed by the resource 74. Accordingly, by using the cloud-based architecture 70, the vehicle is able to offload computing tasks may be expensive or difficult for the BCM 36 to compute using its own computing capacities.

Figure 6:
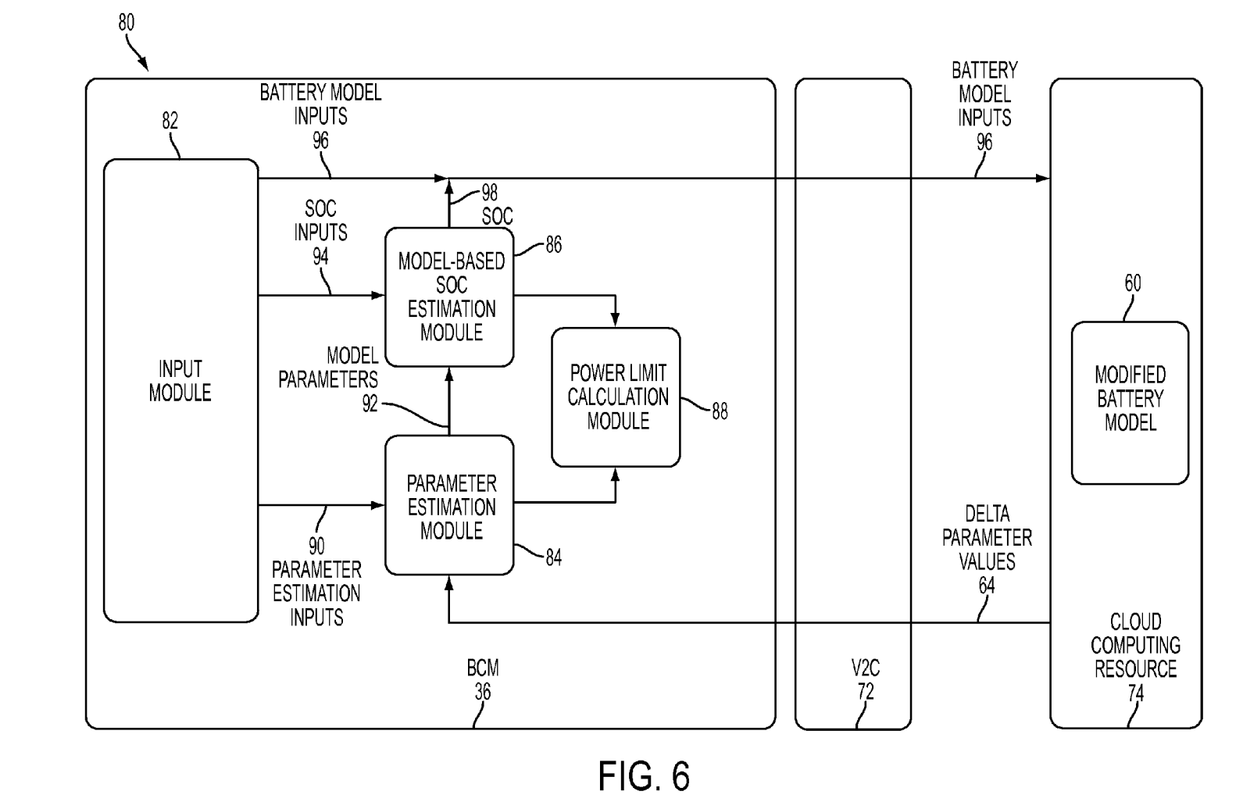
FIG. 6 is a diagram of a state of charge observer architecture utilizing the cloud-based architecture for offloading computation of delta parameter values to a cloud computing resource.

FIG. 6 is a diagram of a state of charge observer architecture 80 utilizing the cloud-based architecture 70 for offloading computation of delta parameter values 64 to the cloud computing resource 74. In the architecture 80, the delta parameter values 64 may be computed by the cloud computing resource 74, and may be provided by the cloud computing resource 74 periodically (e.g., at discrete intervals such as every second, every 15 seconds, every 3 minutes, etc.). Moreover, the nominal values 62 calculations may be computed by the BCM 36, regardless of the communication rate or connection status to the cloud computing resource 74. The delta parameter values 64 may be utilized by the vehicle to update computation of model parameters 92 by applying the deltas identified by the cloud computing resource 74 to the nominal values 62 as determined by the BCM 36. As the computation of the nominal values 62 is performed based on the current battery measurements regardless of the updates received from the cloud computing resource 74, the architecture 80 provides for a reduction in parameter error growth rates between cloud updates, as well as for a more robust cloud-based battery state determination.

More specifically, the architecture 80 includes an input module 82 configured to receive sensor inputs, and provide the inputs for use by other modules of the architecture 80. A model-based SOC estimation module 86 may be configured to receive model parameters 92 from the input module 82 and estimate SOC 98. The cloud module 72 may be configured to forward battery model inputs 96 from the input module 82 and the estimated SOC 98 to the cloud computing resource 74, and to receive delta parameter values 64 computing by the cloud computing resource 74 according to the modified battery equivalent circuit model 60. A parameter estimation module 84 may configured to receive the delta parameter values 64 from the cloud computing resource 74 periodically (e.g., at discrete intervals such as every second, every 15 seconds, every 3 minutes, etc.), determine nominal values 62 according to parameter estimation inputs 90 received from the input module 82, and perform combination of the nominal values 62 and delta parameters values 64 to determine the model parameters 92. A power limit calculation module 88 may be configured to determine a power limit for the battery (e.g., the maximum rate energy can be transfer into and out of the battery) based on factors such as battery age and temperature. Notably, the nominal values 62 calculations may be computed continuously by the vehicle regardless of the cloud communication rate and cloud connection status. Accordingly, computation of the nominal values 62 regardless of the updates received from the cloud provides for a reduction in parameter error growth rates between cloud updates, as well as for a more robust cloud-based battery control system.

The input module 82 may be configured to receive inputs to be used in calculating model parameters 92. For a modified battery equivalent circuit model 60, these inputs may include, as some examples, voltage, current, temperature. The inputs collected by the input module 82 may include information received by the BCM 36 from the sensor modules 34, such as cell level voltage, current and temperature measurements, as well as battery pack 14 level characteristics received by the BCM 36 such as pack current 38, pack voltage 40 and pack temperature 42.

The model-based SOC estimation module 86 may be configured to provide the collected battery model inputs 96 and an estimated SOC 98 to cloud module 72 for processing by the cloud computing resource 74 (e.g., flow 2 as illustrated in the architecture 70). The initial estimated SOC 98 may be determined, for example, according to a measurement of OCV of the battery pack 14 at key-on, or according to a method of SOC computation not requiring model parameters 92, such as ampere-hour integration computed according to current measurement battery model inputs 96 received from the input module 82.

The cloud computing resource 74 may be configured to receive the forwarded battery model inputs 96 from the input module 82 and the estimated SOC 98, and compute the delta parameter values 64. The cloud computing resource 74 may perform the computation of the delta parameter value 64 according to the modified battery equivalent circuit model 60 discussed in detail above. For example, the cloud computing resource 74 may utilize an extended Kalman filter to determine model parameters 92, and may determine the delta parameter values 64 as a difference between the model parameters 92 and the nominal parameter values 62 (e.g., also computed by the cloud computing resource 74 using the same function utilized by the BCM 36, received by the cloud computing resource 74 from the BCM 36, etc.). The delta parameters can alternatively be directly identified by a Kalman Filter. The cloud computing resource 74 may be further configured to return the determined delta parameter values 64 to the parameter estimation module 84, via the cloud module 72 (e.g., flow 5 as illustrated in the architecture 70).

The parameter estimation module 84 may be configured to estimate nominal parameter values 62 according to a function of received parameter estimation inputs 90. The parameter estimation inputs 90 may include, for example, battery temperature and possibly other variables such as cumulative Amp-hour throughput or SOC 98. Based on the nominal parameter values 62 and delta parameter values 64, the parameter estimation module 84 may be configured to compute the battery model parameters 92. For example, using the modified battery cell equivalent model 60, the resistance 52, resistance 54 and capacitance 56 values may be determined as a sum of corresponding nominal parameter values 62 and delta parameter values 64. Or, using the alternate modified battery cell equivalent model 60, the resistance 52, resistance 54 and capacitance 56 values may be determined by giving the delta parameter values 64 a multiplicative effect on the corresponding nominal parameter values 62. The model parameters 92 may then be provided to the model-based SOC estimation module 86.

The model-based SOC estimation module 86 may be configured to estimate the SOC 98 of the battery pack 14. For example, an observer of the SOC estimation module 86 may be driven according to the model parameters 92 received from the input module 82. The observer may be implemented according to a model such as the modified battery cell equivalent circuit model 60 illustrated in FIG. 4 and explained in detail above.

The power limit calculation module 88 may be configured to determine an overall capacity of the battery pack 14. For example, the power limit calculation module 88 may be configured to determine a power limit for the battery (e.g., the maximum rate energy can be transfer into and out of the battery) based on factors such as battery age and temperature.

Notably, between received delta parameter value 64 updates, the BCM 36 may be continue to estimate SOC 98 using updated feed-forward nominal values 62 and the most recently received delta parameter value 64. Thus, utilizing the architecture 80, the nominal parameter values 62 may be updated continuously (feed-forward) while the delta parameter values 64 may be updated periodically based on an update rate from the cloud computing resource 74. The continued updating of the nominal parameter values 62 accordingly results in significantly reduced model parameters 92 error growth between receipt of updates from the cloud computing resource 74. Moreover, the model parameters 92 estimates provided by the parameter estimation module 84 may also be more robust to vehicle to cloud information loss and intermittent cloud connectivity.

Figure 7:
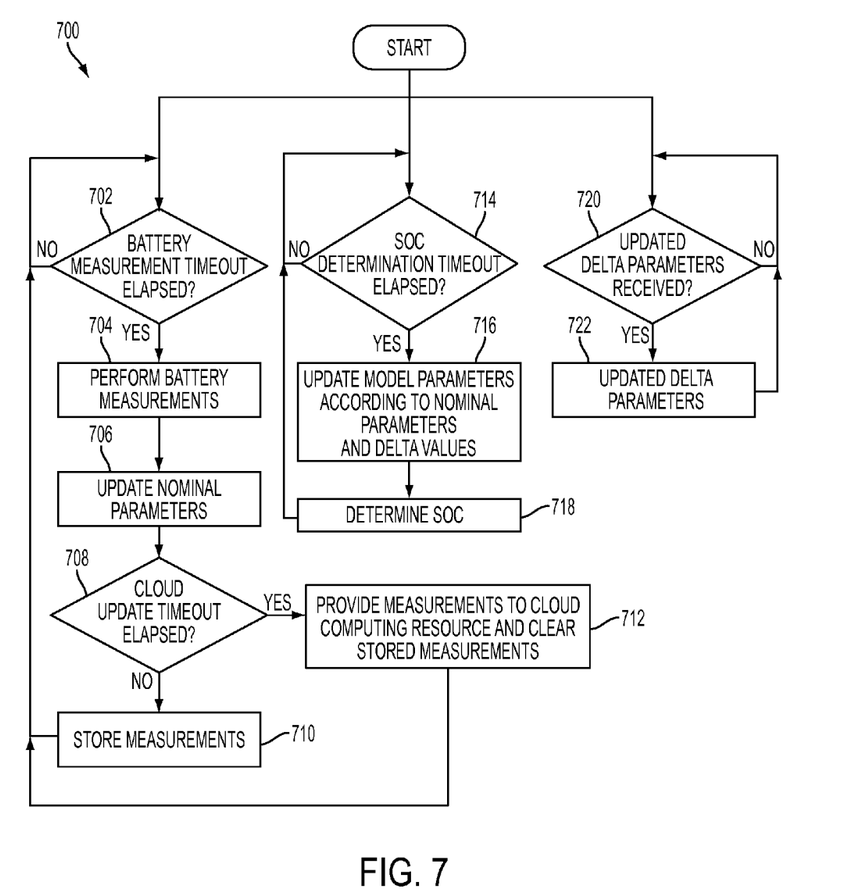
FIGS. 7-8 are diagrams of a method for offloading aspects of parameter identification tasks from a vehicle to a cloud-based architecture.

FIG. 7 is a diagram of a method 700 for offloading parameter identification tasks from a vehicle. The method 700 may be performed, for example, by the cloud module 72 and BCM 36 of a vehicle in communication with the cloud computing resource 74.

At decision point 702, the BCM 36 determines whether a battery measurement timeout has elapsed. For example, the BCM 36 may be configured to periodically perform battery measurements (e.g., every second, every 15 seconds, every 3 minutes, etc.) If the battery measurement timeout has expired, control passes to block 704. Otherwise, control remains at decision point 702.

At block 704, the BCM 36 performs battery measurement. For example, the BCM 36 may utilize sensor modules 34 of the vehicle to measure battery cell characteristics, such as the voltage, current, and temperature of each cell may be measured. As another example, the BCM 36 may measure battery pack 14 level characteristics, such as pack current 38, pack voltage 40 and pack temperature 42.

At block 706, the BCM 36 updates the nominal parameters. For example, using the battery measurements as parameter estimation inputs 90, the parameter estimation module 84 may predict the nominal or ideal parameter values of each battery parameter in a feed-forward manner according to the smooth function.

At decision point 708, the BCM 36 determines whether a cloud update timeout has elapsed. For example, the BCM 36 may be configured to periodically provide battery measurements to the cloud module 72 (e.g., every second, every 15 seconds, every 3 minutes, etc.) In many examples, the cloud update timeout may be for a longer timeout than that of the battery measurement timeout, allowing for faster nominal parameter updates than cloud updates. If the cloud update timer has elapsed, control passes to block 712. Otherwise, control passes to block 710.

At block 710, the BCM 36 stores the battery measurements. For example, the BCM 36 may maintain one or more sets of battery measurements to be sent to the cloud module 72 upon expiration of the cloud update timeout. After block 710, control passes to decision point 702.

At block 712, the BCM 36 provides the battery measurements to the cloud module 72. For example, the BCM 36 may send one or more messages over a vehicle bus to the cloud module 72 including the battery measurements. The BCM 36 may further provide additional information to the cloud module 72 that may be useful for determination of model parameters based on the utilized model, such as a previously computed SOC value determined according to an earlier state observation performed by the BCM 36. After block 712, control passes to decision point 702.

At decision point 714, BCM 36 determines whether an SOC determination timeout has elapsed. For example, the BCM 36 may be configured to determine SOC for use by vehicle systems such as the hybrid drivetrain, or user interface elements of the vehicle that indicate the current level of charge. The SOC determination may be performed periodically as well (e.g., every second, every 15 seconds, every 3 minutes, etc.) If the SOC determination timeout has expired, control passes to block 716. Otherwise, control remains at decision point 714.

At block 716, the BCM 36 updates the model parameters 92. For example, using the modified battery cell equivalent model 60 structure as illustrated in FIG. 4 and explained in detail above, the parameter estimation module 84 may predict the nominal or ideal value of each battery parameter in a feed-forward manner according to the smooth function of parameter estimation inputs 90 received from the input module 82. The parameter estimation inputs 90 may include, for example, battery temperature and possibly other variables such as cumulative Amp-hour throughput or SOC 98. The parameter estimation module 84 may further utilize the most recent delta parameter values 64 to update computation of model parameters 92 by applying the deltas identified by the cloud computing resource 74 to the determined nominal values 62. For example, using the modified battery cell equivalent model 60, the resistance 52, resistance 54 and capacitance 56 values may be determined as a sum of corresponding nominal parameter values 62 and delta parameter values 64. Or, using the alternate modified battery cell equivalent model 60, the resistance 52, resistance 54 and capacitance 56 values may be determined by giving the delta parameter values 64 a multiplicative effect on the corresponding nominal parameter values 62. The model parameters 92 may then be provided to the model-based SOC estimation module 86.

At block 718, the BCM 36 determines SOC. For example, the SOC estimation module 86 of the BCM 36 may receive the model parameters 92 from the parameter estimation module 84, and may estimate the SOC 98 of the battery pack 14. An observer of the SOC estimation module 86 utilizing the model parameters 92 may be driven according to the SOC inputs 94 received from the input module 82. The observer may be implemented according to a model such as the modified battery cell equivalent circuit model 60 explained in detail above. After block 718, control passes to decision point 714.

At decision point 720, the BCM 36 determines whether updated delta parameter values 64 were received by the BCM 36. For example, the BCM 36 may identify whether delta parameter values 64 were received by the BCM 36 from the cloud module 72, or whether received delta parameter value 64 are more recent than the delta parameter values 64 currently being maintained by the BCM 36. If updated delta parameter values 64 are determined by the BCM 36 to be received, control passes to block 722. Otherwise control remains at decision point 720.

At block 722, the BCM 36 updates the delta parameter values 64 maintained by the BCM 36. After block 716, control passes to decision point 720.

Figure 8:
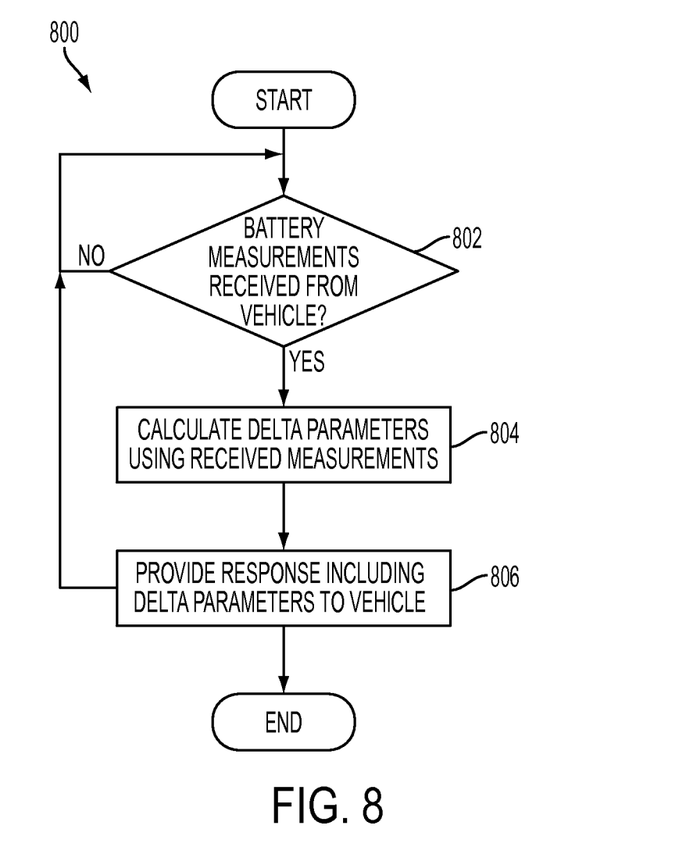

FIG. 8 is a diagram of a method 800 for offloading parameter identification tasks from a vehicle. The method 800 may be performed, for example, by the cloud computing resource 74 in communication with the cloud module 72 interfacing to the BCM 36.

At decision point 802, the cloud computing resource 74 determines whether battery measurements have been received from a vehicle. For example, a cloud module 202 of a vehicle may have provided a message to the cloud computing resource 74, such as discussed above with respect to the method 700. If a message is received, control passes to block 804 to process the message. Otherwise control remains at decision point 802.

At block 804, the cloud computing resource 74 calculates delta parameter values 64 using the received measurements. For example, the cloud computing resource 74 may perform the computation of the delta parameter value 64 according to the modified battery equivalent circuit model 60 discussed in detail above. The cloud computing resource 74 may utilize an extended Kalman filter to determine model parameters 92, and may determine the delta parameter values 64 as a difference between the model parameters 92 and the nominal parameter values 62 (e.g., also computed by the cloud computing resource 74, received by the cloud computing resource 74 from the BCM 36, etc.).

At block 806, the cloud computing resource 74 provides a response to the vehicle including the calculated model parameters. For example, the cloud computing resource 74 may be configured to return the determined delta parameter values 64 to the cloud module 72, to be returned to the parameter estimation module 84 by the vehicle. Accordingly, by using the cloud-based architecture 70, the vehicle is able to offload determination of model parameters that may be expensive or difficult for the BCM 36 to compute using its own computing capacities. After block 806, control passes to decision point 802.

Thus, by partitioning the determination of model parameters 92 into a known nominal value 62 feed-forward function portion and an unknown delta parameters value 64 portion, the vehicle may be configured to improve the accuracy of SOC computation beyond the computing and storage constraints of the onboard BCM 36, while also allowing for slower cloud update rates between the vehicle and the cloud computing resource 74 as may be required for approaches that offload the entire computation of the model parameters 92. Because of the relatively slow variance in the model parameters 92, as well as the computational complexity involved, the computation of delta parameter value 64 updates according to the modified battery equivalent circuit model 60 may be suitable offloading to the cloud computing resource 74. Moreover, updated nominal parameter value 62 computations may be suitable to be performed by the vehicle, thereby providing for better SOC estimation than simple reliance on remotely calculated model parameters, while also minimizing the effect of potential intermittent data loss between the vehicle and the cloud computing resources 74.

While exemplary embodiments are described above, it is not intended that these embodiments describe all possible forms of the invention. Rather, the words used in the specification are words of description rather than limitation, and it is understood that various changes may be made without departing from the spirit and scope of the invention. Additionally, the features of various implementing embodiments may be combined to form further embodiments of the invention.

What is claimed is:

1. A vehicle comprising:
   battery cells; and
   a controller configured to control the vehicle, based on a state observation of the battery cells, using model parameters computed according to controller-determined cell nominal parameters adjusted by remotely-determined cell delta parameters, the delta parameters received from an external computing device responsive to cell measurements relating to a cell battery model sent to the external computing device, the delta parameters indicating adjustments that improve accuracy of the nominal parameters.

2. The vehicle of claim 1, wherein the controller is further configured to estimate the nominal parameters according to a function of the cell measurements, and the cell measurements include cell voltage, cell current and cell temperature.

3. The vehicle of claim 1, wherein each nominal parameter has an associated delta parameter, and the controller is further configured to identify each of the model parameters as one of (i) a sum of a nominal parameter and an associated delta parameter, and (ii) a product of the nominal parameter and the associated delta parameter.

4. The vehicle of claim 1, wherein the battery model includes a battery equivalent circuit model, and the controller is further configured to perform the state observation to estimate battery state of charge (SOC).

5. The vehicle of claim 4, wherein the measurements further include a previous estimate of battery SOC.

6. The vehicle of claim 4, wherein the controller is further configured to compute an initial estimate of SOC according to ampere-hour integration.

7. A system comprising:
   a computing device configured to
      receive, from a vehicle via a communication network, battery cell measurements corresponding to a battery model of battery cells of the vehicle; and
      send, to the vehicle via the communication network responsive to the measurements, cell delta parameters indicating adjustments to cell nominal parameters determined by the vehicle for the cells, the delta parameters indicating adjustments that improve accuracy of the nominal parameters.

8. The system of claim 7, wherein the measurements include measurements of cell voltage, cell current and cell temperature.

9. The system of claim 7, wherein the battery model includes a battery equivalent circuit model configured to supply battery equivalent circuit model parameters to estimate a battery state of charge (SOC).

10. The system of claim 9, wherein the measurements further include a previous estimate of battery SOC.

11. The system of claim 7, wherein the computing device is further configured to
    estimate the nominal parameters according to a function of the cell measurements; and
    compute the cell delta parameters as a difference of model parameters identified according to a battery equivalent circuit model and the nominal parameters.

12. The system of claim 7, wherein the computing device is further configured to compute the cell delta parameters according to direct identification of model parameters identified according to a battery equivalent circuit model.

13. A method comprising:
    controlling a vehicle by a controller, based on a state observation of battery cells, using model parameters computed according to controller-determined cell nominal parameters adjusted by remotely-determined cell delta parameters, the delta parameters received by the controller from an external computing device responsive to cell measurements relating to a battery model sent to the computing device, the delta parameters indicating adjustments that improve accuracy of the nominal parameters.

14. The method of claim 13, further comprising estimating the nominal parameters according to a function of the cell measurements, the cell measurements including cell voltage, cell current and cell temperature.

15. The method of claim 13, wherein each nominal parameter has an associated delta parameter, and further comprising identifying each of the model parameters as one of (i) a sum of a nominal parameter and an associated delta parameter, and (ii) a product of the nominal parameter and the associated delta parameter.

16. The method of claim 13, wherein the battery model includes a battery equivalent circuit model, and further comprising performing the state observation to estimate battery state of charge (SOC).

17. The method of claim 13, wherein the measurements further include a previous estimate of battery SOC.

18. The method of claim 13, further comprising computing an initial estimate of SOC according to ampere-hour integration.

\* \* \* \* \*